United States Patent
Wong et al.

(10) Patent No.: US 8,651,703 B2
(45) Date of Patent: Feb. 18, 2014

(54) LIGHT EMITTING DEVICE USING FILTER ELEMENT

(75) Inventors: Kum Soon Wong, Kuala Lumpur (MY); Farn Hin Chen, Ipoh Perak (MY); Kean Loo Keh, Jalan Yeap Chor Ee Gelugor Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 790 days.

(21) Appl. No.: 12/757,463

(22) Filed: Apr. 9, 2010

(65) Prior Publication Data

US 2011/0249422 A1    Oct. 13, 2011

(51) Int. Cl.
    *F21V 9/00*    (2006.01)
(52) U.S. Cl.
    USPC ............... 362/293; 362/17; 362/84; 362/235; 362/311.02; 362/343; 257/98
(58) Field of Classification Search
    USPC ........ 362/17, 84, 235, 293, 260, 307, 311.02, 362/343; 257/98; 313/502
    See application file for complete search history.

(56) References Cited

U.S. PATENT DOCUMENTS

| 5,959,316 A | 9/1999 | Lowery |
| 6,791,259 B1 | 9/2004 | Stokes et al. |
| 2006/0099449 A1* | 5/2006 | Amano et al. ................. 428/690 |
| 2006/0181900 A1* | 8/2006 | Wu ................................ 362/609 |
| 2008/0203414 A1 | 8/2008 | Yen et al. |

FOREIGN PATENT DOCUMENTS

CN    2485800    4/2002

OTHER PUBLICATIONS

Liu, Zongyuan et al., "Analysis of Factors Affecting Color Distribution of White LEDs", *IEEE, 2008 International Conference on Electronic Packaging Technology & High Density Packaging (ICEPT-HDP 2008)* Aug. 22, 2008.

* cited by examiner

*Primary Examiner* — Stephen F Husar
*Assistant Examiner* — Meghan Dunwiddie
(74) *Attorney, Agent, or Firm* — Fox Rothschild LLP

(57) ABSTRACT

A light emitting device with at least one LED die, a filter element and a reflective element. The filter element may be configured to preferentially attenuate light passing through the filter element, such that light output has improved color uniformity when compared to similar light emitting devices without a filter element.

20 Claims, 5 Drawing Sheets

LIGHT EMITTING DEVICE USING FILTER ELEMENT

BACKGROUND

A light emitting Diode (referred to hereinafter as LED) represents one of the most popular light emitting devices today. LEDs may be used in low power applications, such as indicator lights for electronic devices. LEDs may also be used in high power applications, such as flash lights, backlit displays, electronic signs, and signal displays. Typically, LEDs with their power efficiency, low cost, and brightness are becoming more and more in demand. However, in certain applications, color uniformity of the light source may be a necessity. For example, a large outdoor electronic sign, having several thousand LEDs or more arranged in matrix, typically requires all the LEDs to be the same or have a uniform color. Similarly, strobe lights, such as those used in camera flash systems require a certain color uniformity to ensure picture quality.

BRIEF DESCRIPTION OF THE DRAWINGS

Illustrative embodiments are described herein by way of example, not by way of limitation, and reference is made to the following drawings, in which the same or like reference numerals between figures refer to the same or similar elements.

DETAILED DESCRIPTION

Figure 1:
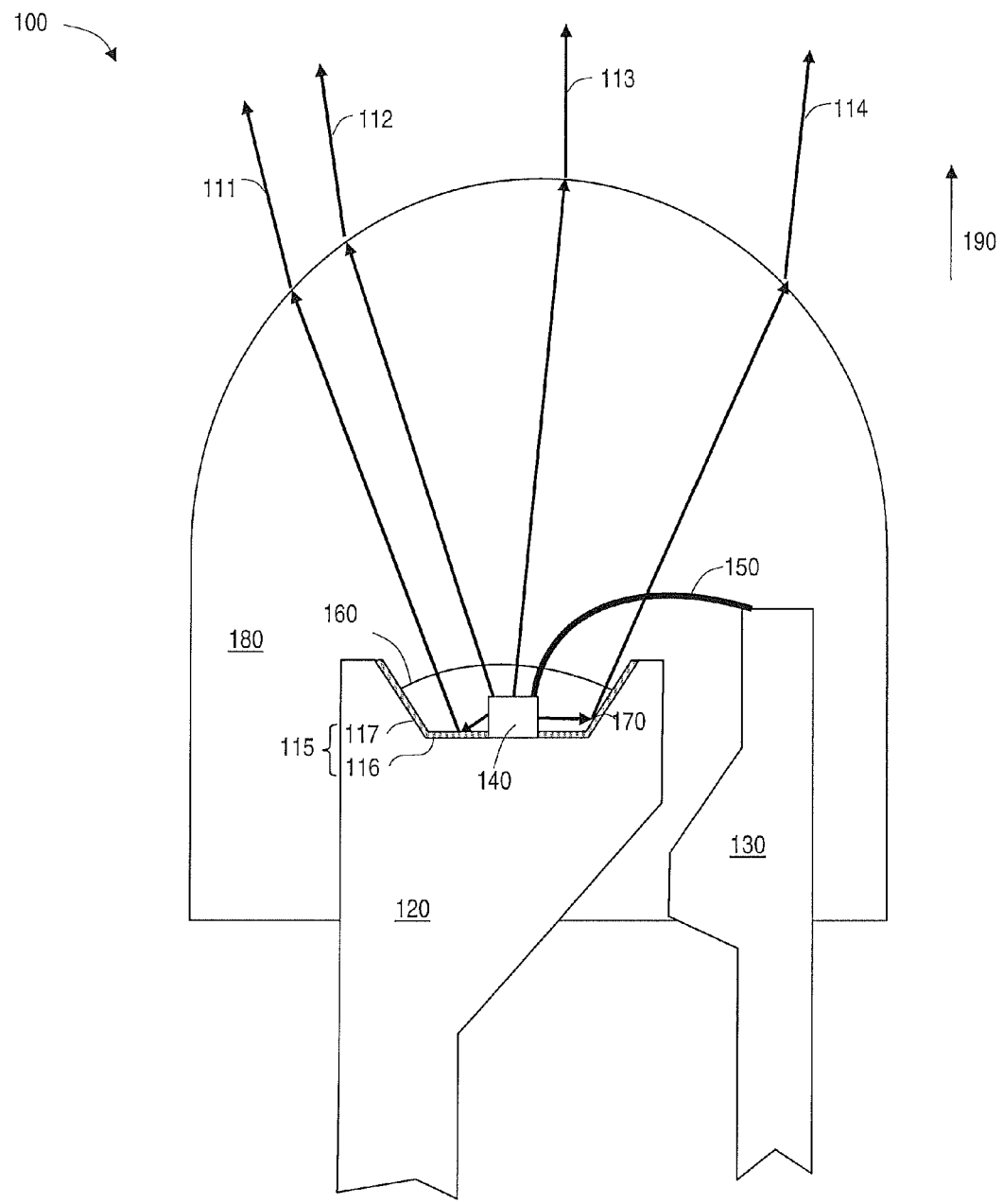
FIG. 1 illustrates a cross-sectional view of a through-hole LED lamp type light emitting device with a lens.

FIG. 1 illustrates an embodiment of a light emitting device 100 in cross sectional view. The light emitting device 100 is a through hole lamp type LED and may be commonly used in electronic sign displays. The light emitting device 100 may comprise an LED die 140, an epoxy based body 180, an anode 120 that may also be configured to form a reflective element 115, a cathode 130, a wavelength converting material 160, and a filter element 170. As shown in FIG. 1, the epoxy based body 180 may be configured to form a lens. The anode 120 and cathode 130 may comprise electrically conductive materials configured to electrically connect the LED die 140 to an external power source (not shown). In some situations that require more light output, for example, there may be more than one LED die 140 housed within the light emitting device 100.

The anode 120 and cathode 130 may be made of one or more metallic materials or alloys, and thus, highly reflective. A portion of the anode 120 or cathode 130 may be configured to form a reflective element 115. In the embodiment illustrated in FIG. 1, a portion of the anode 120 forms the reflective element 115. The reflective element 115 may comprise a mounting surface 116 and a reflective surface 117. The mounting surface 116 may be substantially flat and highly reflective. The mounting surface 116, together with the reflective surface 117, may form a cup shape as illustrated in FIG. 1, in order to direct light in a relatively forward direction 190.

Although theoretically, the LED die 140 may be a point light source emitting light in all directions, such construction may not be practical. Light emitting devices 100 may be configured to emit light in a particular direction by utilizing a reflective element 115. A reflective element 115 may be a reflector, any reflective surface, one or more conically or cup shaped reflective surfaces, or any combination of the above. In the embodiment shown in FIG. 1, the reflective element 115 may be configured to direct light in a direction 190 substantially forward of the light emitting device 100.

A portion of the mounting surface 116 may be configured to hold the LED die 140. A wire bond 150 may connect the LED die 140 to the cathode 130, as shown in FIG. 1. Depending on the type of LED die 140, another wire bond (not shown) may connect the LED die 140 to the anode 120. Alternatively, electrical connection can be accomplished by means of physical contact. For example, the LED die 140 in FIG. 1 may be electrically connected to the anode 120 when the LED die 140 is physically attached to the mounting surface 116. The mounting surface 116 may be electrically part of or connected to the anode 120.

The LED die 140 may be configured to emit a first light radiation. The first light radiation emitted by the LED die 140 may be a monochromatic light with a single peak wavelength. The first light radiation emitted by the LED die 140 may be a visible light giving the effect of any color or a light invisible light to the human eye, such as infrared and ultraviolet light. For example, most white LEDs currently in production utilize dies with a peak wavelength in the blue to ultraviolet range. The first light radiation may be emitted into the wavelength converting material 160 and converted thereafter into a second light radiation having a multiplicity of wavelengths. The multiplicity of wavelengths of the second light radiation may have the effect of being perceived by the human eye as white light.

As shown in embodiment in FIG. 1, the wavelength converting material 160 can be disposed on the LED die 140 such that the entire LED die 140 may be covered or enveloped by the wavelength converting material 160. The wavelength converting material 160 may be a yellow emitting phosphor such as YAG (Yttrium Aluminum Garnet) phosphor or TAG (Terbium Aluminum Garnet) phosphor, or other similar material. For example, most of the white LEDs currently in production typically use YAG phosphor, and a blue light emitting die, in order to obtain white light.

Another candidate for the wavelength converting material 160 may be quantum dots. Quantum dots are semiconductor nanocrystals that possess unique optical properties. Quantum dots may be coated on a blue die to obtain white light. However, quantum dots may be tuned to obtain almost any desired color and are not simply limited to white light due to their unique optical properties. It should be noted that the wavelength converting material 160 should not be limited to only the above mentioned examples. The wavelength converting material 160 may include any material capable of transforming the wavelength of the first light radiation into a second desired light radiation having different optical properties.

As illustrated in FIG. 1, light emitted from the LED die 140 may be emitted into the wavelength converting material 160 and then directly into the forward direction 190, such as rays 112 and 113. Simultaneously, light may be emitted into the wavelength converting material 160 first and then be reflected by the reflective element 115 towards the forward direction 190. The light may be reflected by the mounting surface 116, as illustrated by ray 111 or at the reflective surface 117, as illustrated by ray 114. When viewed from the forward direction 190, the light output may be in a circular shape. As illustrated in FIG. 1, rays 111, 112, and 114 may contribute to an outer ring of the light output, whereas ray 113 may contribute to an inner ring of the light output.

In some circumstances, the light output may not appear to have an acceptable color uniformity. For example, the outer ring of the light output may appear yellowish. This phenomenon is known as the yellow ring effect. Light emitting devices with yellow ring effect may not be acceptable in certain applications, such as flash lights used in cameras, as well as LEDs used in automotive indicator displays and large electronic display signs. The yellow ring effect cannot be fully explained, but studies have shown that yellow ring may be affected by two factors. The first factor is the physical condition of the phosphor or wavelength converting material 160, which may include its thickness, concentration, and the physical shape of the layer. The second factor is the optical structure design. For example, in the light emitting device 100 shown in FIG. 1, the physical shape and design of the reflective element 115 may contribute to the yellow ring effect.

Logically, one may deduce that rays 111 and 114 being reflected by the reflective element 115, and thus traveling the furthest distance in the wavelength converting material 160 may be a major contributing factor toward the color change. Rays 112 and 113 may not contribute as much towards the overall color uniformity situation as rays 111 and 114.

By disposing the filter element 170 on the reflective element 115, the wavelengths of rays 111 and 114 can be controlled more precisely. This can be accomplished by attenuating or filtering out undesirable colors in the emitted light radiation. Specifically, using a blue die and yellow emitting phosphor such as YAG, rays 111 and 114 of the light emitting device 100 may typically appear yellowish or appear to have a yellowish outer ring. In order to improve the color uniformity of the emitted light, the filter element 170 may be designed or configured to preferentially attenuate yellowish light. More details about the filter element 170 will be discussed in further detail with reference to FIGS. 4A and 4B, herein below.

Figure 2:
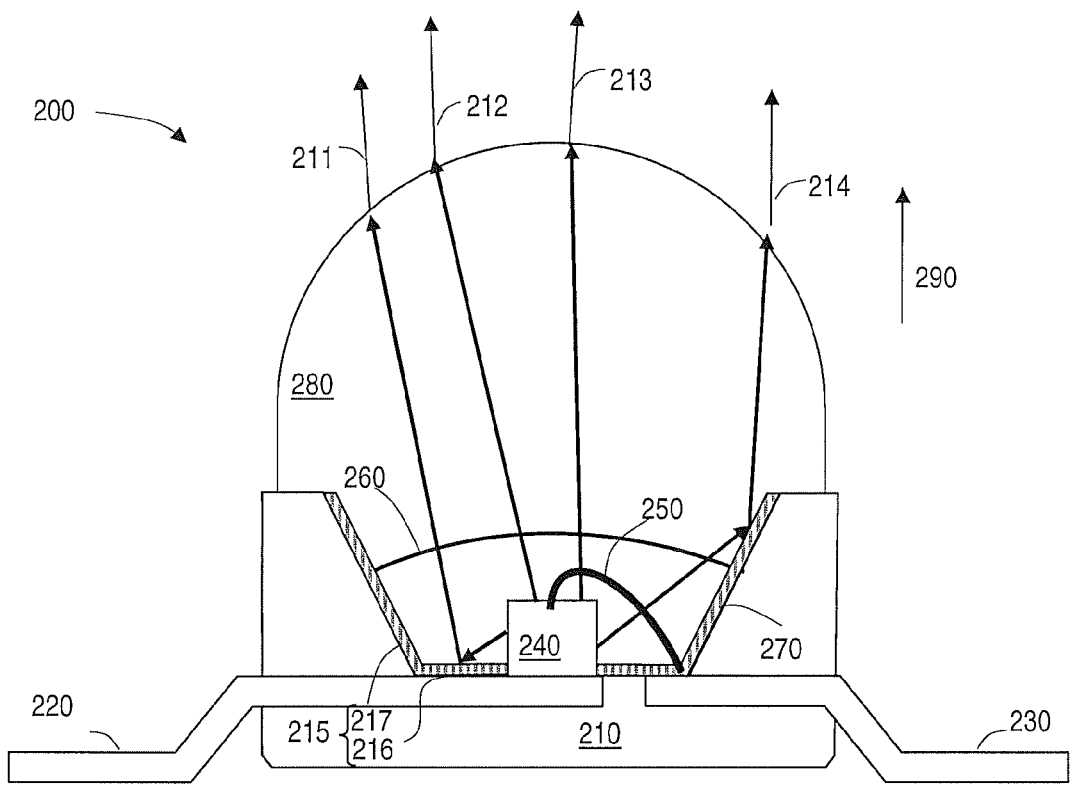
FIG. 2 illustrates a cross-sectional view of a ceramic LED type light emitting device with a lens.

The filter element 170 may be implemented in other types of light emitting devices, such as ceramic LEDs and printed circuit board (referred hereinafter as PCB) based LEDs. FIG. 2 illustrates a cross-sectional view of a light emitting device 200 which may commonly be used in electronic display signs, camera flash lights, automotive displays, LCD displays, along with other similar applications. The light emitting device 200 may be a ceramic LED. The light emitting device 200 may comprise an LED die 240, lead frames that may also form cathode 230 and anode 220, a ceramic body 210, a wavelength converting material 260, a filter element 270 and an epoxy material 280.

A portion of the ceramic body 210 may form a reflective element 215. The reflective element 215 may further comprise a mounting surface 216 and a reflective surface 217. The reflective element 215 may be configured to direct light in a substantially forward direction 290. The LED die 240 may be electrically connected to the cathode 230 by means of a wire bond 250 and to the anode 220 by means of physical contact at the mounting surface 216. A portion or all of the epoxy material 280 may form a lens.

When viewed from the forward direction 290, the light output emitted by the light emitting device 200 may appear as a substantially circular shape. Rays 211, 212, and 214 may appear as part of an outer ring and ray 213 may appear as part of an inner ring of the emitted light output. Rays 211 and 214, which have been reflected by the reflective element 115 may likely contribute more towards the color uniformity issues discussed earlier herein above. A filter element 270 disposed on the reflective element 215 may improve the color uniformity situation by filtering out radiation of undesirable color wavelengths.

Figure 3:
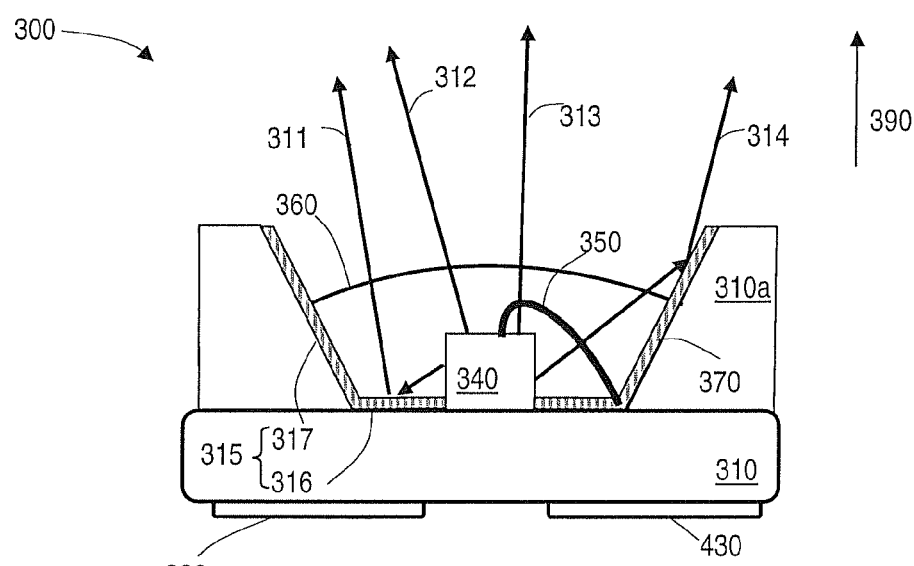
FIG. 3 illustrates a cross-sectional view of a printed circuit board (PCB) based LED type light emitting device without a lens.

Similar improvements in color uniformity may be observed in other types of light emitting devices, such as the PCB based LED shown in FIG. 3. A cross-sectional view of a light emitting device 300 is shown in FIG. 3. The light emitting device 300 may comprises a PCB substrate 310, soldering pads 320 and 330, an optical structure 310a, an LED die 340, a wavelength converting material 360 and a filter element 370. In FIG. 3, the anode (not shown) and cathode (not shown) of the LED die 340 may be electrically connected to the soldering pads 320 and 330 by means of conductors (not shown) embedded inside the PCB. A wire bond 350 may connect the LED die 340 to a conductor (not shown) of the PCB substrate 310.

The PCB substrate 310 may comprise a mounting surface 316 that may be a conductive pad located on the PCB. The optical structure 310a may comprise a reflective surface 317. When the optical structure 310a is attached to the PCB substrate 310, the reflective surface 317 abuts the mounting surface 316 and forms a conically-shaped reflective element 315. The reflective element 315 may be configured to direct light emitted by the LED die 340 in a substantially forward direction 390.

When viewed from the forward direction 390, the light output may appear to be in a substantially circular shape. Rays 311, 312, and 314 may appear as part of an outer ring of the light output. Ray 313 may appear as part of an inner ring of the light output. Rays 311 and 314, which have been reflected at the reflective element 315, may contribute more towards the color uniformity issues than the direct rays 312 and 313, as previously discussed. Having a filter element 370 may improve color uniformity by filtering out or preferentially attenuating light radiation of undesirable color wavelengths.

In summary, different types of light emitting devices may have different materials used as reflective elements and different fabrication methods. For example, in the embodiment shown in FIG. 1, the reflective element 115 can be metal, a metal alloy, or metal compound. In the embodiment shown in FIG. 2, the reflective element 215 can be part of the ceramic body 210. Whereas in the embodiment shown in FIG. 3, the reflective element 315 can be a metal material at the mounting surface 316 and a plastic material at the reflective surface 317. However, many of these light emitting devices may be susceptible to color uniformity issues. As shown in the embodiments in FIG. 1-3, by utilizing filter elements 170, 270 and 370, color uniformity may be improved. For simplicity, discussion hereinafter will be focused on the embodiment shown in FIG. 2. It should be noted that similar concepts and teachings be applied to other light emitting devices.

The filter element may be an interference filter. Interference filters are widely used commercially in lenses found in cameras. Typically, the interference filter is formed by depositing a plurality of thin layers of transparent dielectric material onto a glass that has a shape of a lens. However, interference filters may be formed on other surfaces, such as wafers, metallic surfaces, epoxy surfaces, or other surface materials, however the process may require minor modifications corresponding to the specific surfaces. The plurality of thin layers of transparent dielectric material may be stacked onto or interlaced with each other. Each layer may be configured to preferentially attenuate light radiation of a specific wavelength. The dielectric layers may comprise magnesium fluoride, lead fluoride, antimony oxide, or similar materials, such as those found in an interference filter as manufactured by Nikon Corporation, Matsunami Glass Industries Ltd or Schott AG. The interference filter technology may enable designs of any desired filter profile by selection of filter materials, by controlling the number of thin layers, and by controlling the thickness of each layer. A color filter profile usually refers to the transmissivity curve as a function of wavelength such as one shown in FIG. 4A or FIG. 4B.

Another type of filter technology that may be utilized for the filter element 370 may be fabricated by coating color resist on the reflective element 215 or on a glass, followed by photo-masking and a UV cure process to remove unnecessary portions. The color resist may be a polymer compound that gives specific color. The flexibility of the filter profile can be limited because the filter profile available depends on the availability of color resist. Most common pigments used may be in red, green, blue, cyan, magenta and yellow color. Pigment color filters may be made of polymer dye such as azo, stylbene, xthantene, oxazine, aminoketone, hytroxyketone, anthraquione dyes, or similar such materials or any combinations of such materials, such as those that may be obtained from Toppan Printing Corporation Ltd or Dai Nippon Printing Corporation Ltd.

The filter element 270 may be disposed onto the reflective element 215, either directly on the reflective element, or formed on a glass which is then formed fit onto the reflective element 215. Most materials used to fabricate filter element 270 are capable of adhering to a glass or plastic surface. Whether a glass is desired or required may depend on the material and technology used to form the filter element 270. For example, when a color pigment which may be used to form the filter element 270 does not adhere to the reflective element 215, the color pigment may be fabricated on a glass or a transparent plastic with a shape similar to the reflective element 215, which is then formed fit onto the reflective element 215.

Figure 4A:
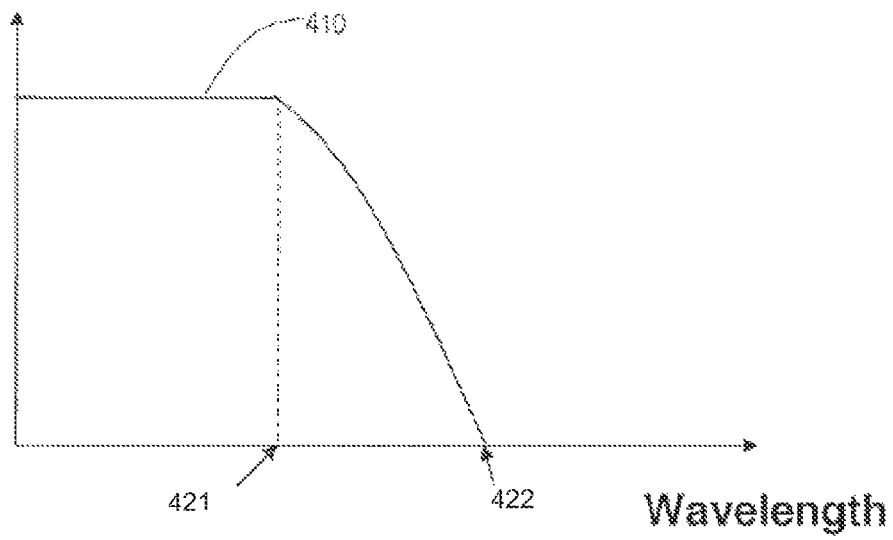
FIG. 4A shows a graph illustrating a transmissivity curve of an interference filter of an LED lamp.

FIG. 4A shows an embodiment of a filter profile of an interference filter, represented by a transmissivity curve 410. The transmissivity curve 410 may remain substantially high until a first wavelength 421 where the transmissivity curve 410 starts to drop. The filter element 270 may allow light radiation with wavelength lower than the first wavelength 421 to pass through with minimum or no loss.

The transmissivity curve 410 may continue to drop between the first wavelength 421, and at a trim wavelength 422 the transmissivity curve 410 may have dropped substantially. The light radiation at and after the trim wavelength 422 may be substantially attenuated while light radiation between the first wavelength 421 and the trim wavelength 422 may be partially attenuated.

The shape of the transmissivity curve 410, the value of the first wavelength 421 and the value of the trim wavelength 422 may be designed or determined through optics simulation. Usually the optics simulator can take into consideration the physical or geometrical shape of wavelength converting material 260, and the optical structures such as reflective element 215. Examples of optics simulators are ASAP from Breault Research Organization, ZEMAX from ZEMAX Development Corporation, and TRACEPRO by Lambda Research Corporation.

For example, one simulation result simulated on the embodiment shown in FIG. 2 using a blue die 240 and yellow light phosphor wavelength converting material 260 using a filter element 270 shows that the first wavelength 421 at 350 nm and the trim wavelength 422 at 550 nm may yield a uniform light output of white color. Without the filter element 270, yellow ring effect is more likely to be observed. With reference to the example of yellow ring effect, depending on the design, the value of the first wavelength 421 may be between 350 nm and 480 nm whereas the trim wavelength 422 may be between 500 nm and 550 nm. The curve prior to the first wavelength 421 will likely only impact light radiation in the invisible region, and therefore, is unlikely to be of any significant effect.

The simulation result may be understandable because the filter element 270 may be designed to preferentially attenuate light above 500 nm-550 nm, which may mean that green and red light radiation are attenuated. A person with ordinary skill in the art will appreciate that attenuating green and red light radiation is equivalent to attenuating yellowish light of the light radiation, as yellow may be obtained by mixing primary green and red light. Thus, the filter element 270 may effectively attenuate yellow light emitted by the light emitting device 200.

Figure 4B:
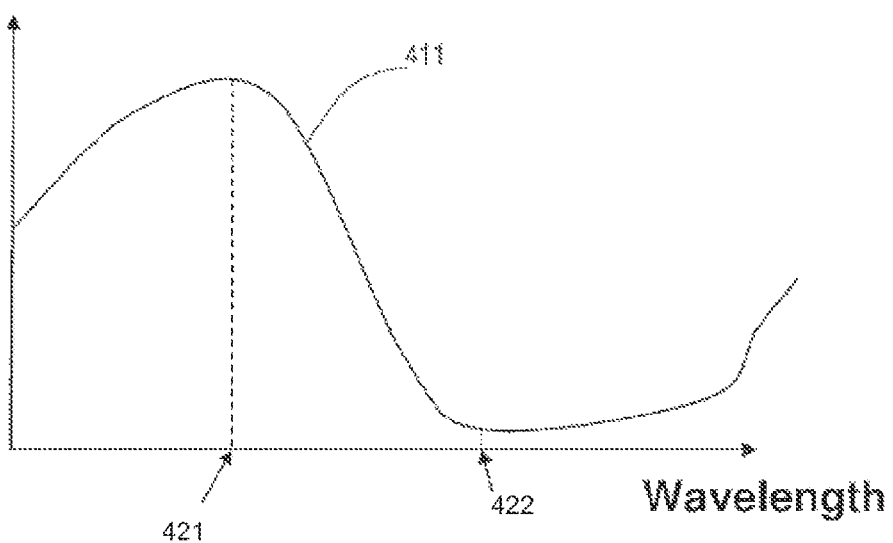
FIG. 4B shows a graph illustrating a transmissivity curve of a pigment color filter of an LED lamp.

A pigment color filter may be made from color resist which may be an organic polymer. Therefore, the filter profile of a pigment color filter may not be designed as freely or as optimally as an interference filter. However, one may select any color resist having the closest color profile to the desired color profile. For example, in order to improve color uniformity due to yellow ring effect, the yellowish color likely needs to be reduced. This may be accomplished by choosing a cyan pigment filter. FIG. 4B shows an embodiment of a filter profile or transmissivity curve 411 of a cyan pigment color filter.

In FIG. 4B, the transmissivity curve 411 peaks at a first wavelength 421 approximately between 350 nm and 450 nm, depending on the type of cyan pigment color filter selected. However, the transmissivity curve 411 drops to minimum at a trim wavelength 422 at approximately 500 nm-550 nm. The transmissivity curve 411 may increase again in the infrared wavelength region, but this likely does not have much effect when perceived by the human eye, as light with a wavelength in the infrared region is typically invisible to the human eye.

Similarly, the transmissivity curve 411 at wavelengths shorter than the first wavelength 421 may not be at maximum or as high as the transmissivity at the first wavelength 421. This will generally not matter, as wavelengths below the first wavelength 421 will likely be in ultraviolet region, and thus, invisible to the human eye. A designer may obtain various pigment filter profiles from pigment filter suppliers and perform optics simulations in order to decide which filter profile yields better uniformity with minimal light losses for a specific light emitting device application. Unlike the interference filter, the profile of the pigment filter depends almost entirely on the color resist and may not be easily manipulated or modified.

Although pigment color filters may have limitations in terms of their filter profile, pigment color filters may have less angular dependence than an interference filter. Pigment color filters may be superior in terms of cost. On the other hand, interference filters may have advantages compared to pigment color filter in terms of reliability and flexibility in obtaining a wider range of filter profiles. However, both pigment color filters and interference filters may be utilized in these embodiments successfully. The choice of filter element 270 for a particular application may depend on design, cost, light output, and manufacturing requirements.

Figure 5:
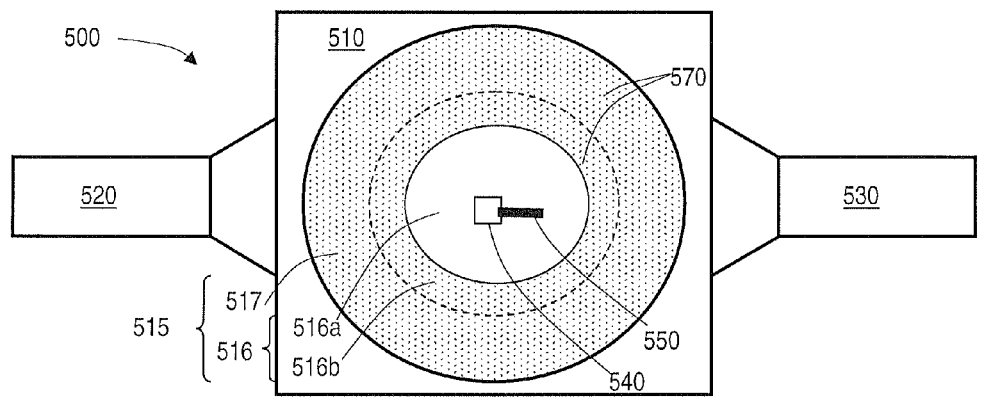
FIG. 5 illustrates a top view of a ceramic LED having a filter element disposed on an outer ring of the mounting surface.

With reference to FIG. 5, a top view of a partially assembled light emitting device 500, without the wavelength converting material 260 and the epoxy material 280, is illustrated. The top view of the light emitting device 500 shows the anode 520, the cathode 530, the body 510, the reflective element 515, the LED die 540, the wire bond 550 and the filter element 570. The reflective element 515 comprises a reflective surface 517 and a mounting surface 516. In FIG. 5, the mounting surface 516 can be divided further into an inner ring portion 516a, and an outer ring portion 516b. As illustrated in FIG. 5, the filter element 570 may be disposed on and covering the outer ring portion 516b of the mounting surface 516. The reflective surface 517 may be covered entirely by the filter element 570, but the inner ring portion 516a of the mounting surface 515 may not be covered. The above may be reversed, in which the inner ring portion 516a may be covered with the filter element 570 while outer ring portion 516b and the reflective surface 517 may not be covered by the filter element 570. This design aspect of the filter element 570 may be decided by conducting optics simulations. Another factor impacting the filter element choice may be manufacturing cost.

For manufacturing convenience or cost considerations, one may elect to cover the entire mounting surface 516 with the filter element 570 and leave the reflective surface 517 uncovered, or cover the reflective surface 517 with filter element 570, but leave the mounting surface 516 uncovered. Alternatively, one may choose to cover both the mounting surface 516 and the reflective surface 517. Yet another option would be the filter element 570 may not be conductive and the area below the LED die 540 may not be covered by the filter element 570.

Figure 6:
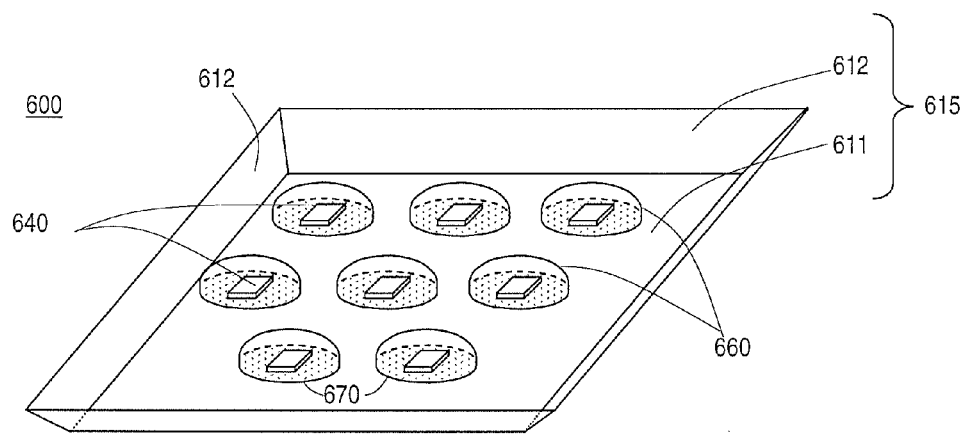
FIG. 6 illustrates a perspective view of a large scale light emitting device having multiple LED dies.

FIG. 6 illustrates an embodiment of large scale light emitting devices 600 with filter element assembled using multiple dies. The large scale light emitting device 600 can be a light emitting device with hundreds or thousands of die such as one used in an electronic display signs systems, or a light emitting device with few dies such as those used in a light bar or a light module. As shown in FIG. 6, the large scale light emitting device 600 comprises a reflective element 615, a wavelength converting material 660, a filter element 670 and a plurality of LED dies 640. The reflective element 615 further comprises a mounting surface 611 and a reflective surface 612.

The LED dies 640 may be arranged in matrix form, for example with a fixed number of columns and rows, or in a form substantially similar to matrix form such as that shown in FIG. 6, or in any desired form to represent a shape, a sign, a symbol, a character or any graphical representation. For a larger device, especially devices used in electronic display signs, the arrangement of the LED dies 640 can be more complicated. For example, the LED dies 640 can be grouped further and each group may comprise dies configured to emit light of different colors. Usually, in an electronic display signs, the LED dies 640 may be addressable such that only certain LED dies 640 can be configured to emit light, giving effect of a shape, a sign or a symbol on the electronic display signs. For such applications, each of the LED die 640 can be configured to turn on or off in accordance with external electronic signals programmed to display such information.

With reference to FIG. 6, the LED dies 640 may be attached to the mounting surface 611. The mounting surface may also function as a reflector for each of the LED dies 640. The reflective surface 612 can be configured to be positioned at the side walls surrounding the array of the LED dies 640. The wavelength converting material 660 can be disposed on and thus envelopes each of the LED dies 640. The filter element 670 can be disposed on the mounting surface 611 under or around each of the LED die 640. Alternatively, the large scale light emitting device 600 may have one common wavelength converting material 660 disposed on the mounting surface 611 enveloping all the LED dies 640. Similarly, the large scale light emitting device 600 may have one common filter element 670 for all LED dies 640.

Figure 7:
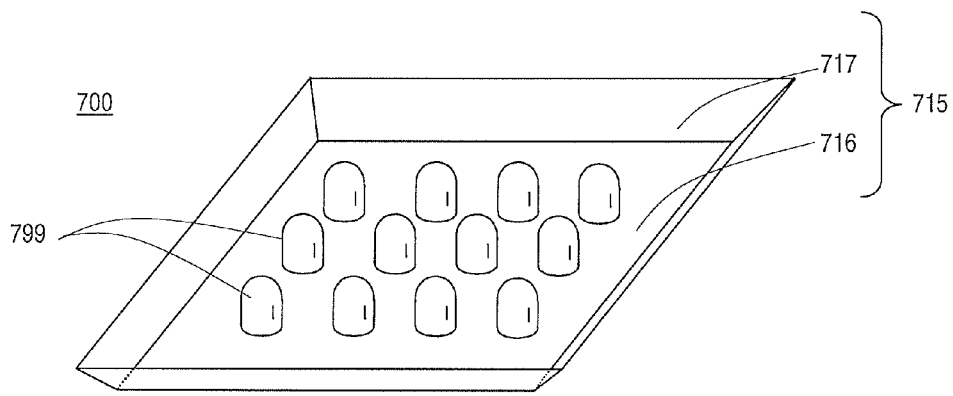
FIG. 7 illustrates a perspective view of a large scale light emitting device assembled using packaged LEDs.

In FIG. 6, additional reflectors can be added onto each of the LED dies 640 such that each reflector directs light emitted by each corresponding LED die 640. Alternatively, a large scale light emitting device may comprise packaged light sources 799 as shown in FIG. 7, which illustrates an embodiment of a large scale light emitting device 700 assembled using packaged LEDs 799. With reference to FIG. 7, the large scale light emitting device 700 comprises a reflective element 715 and a plurality of packaged LEDs 799. The packaged LEDs 799 may be a through hole lamp type LEDs, such as the light emitting device 100 shown in FIG. 1; ceramic LEDs, such as the light emitting device 200 shown in FIG. 2; or PCB based LEDs, such as the light emitting device 300 shown in FIG. 3. The arrangement of the packaged LEDs 799 may be in a grid or matrix format, similar to the arrangement of the LED dies 640 discussed in FIG. 6, or in another pattern as required by the particular application.

The reflective element 715 further comprises a mounting surface 711 and if desired, a reflective surface 712. As discussed in the embodiments shown in FIGS. 1-3, the packaged LEDs 799 may further comprise a single die or a plurality of dies with the same or different color wavelengths, a reflective element and a filter element. Effectively, the large scale light emitting device 700 in FIG. 7 may be substantially similar to the large scale light emitting device 600 as discussed in FIG. 6. One major difference is the LED dies of the packaged LEDs 799, may be first assembled into a packaged LEDs 799, and the attacked to the mounting surface 711 in FIG. 7. In other words, the LED dies may be attached indirectly onto the mounting surface 711 of the large scale light emitting device 711, as the dies are first attached to their own individual substrates, packaged and then the entire packaged LED 799 is attached to the mounting surface 711.

Figure 8:
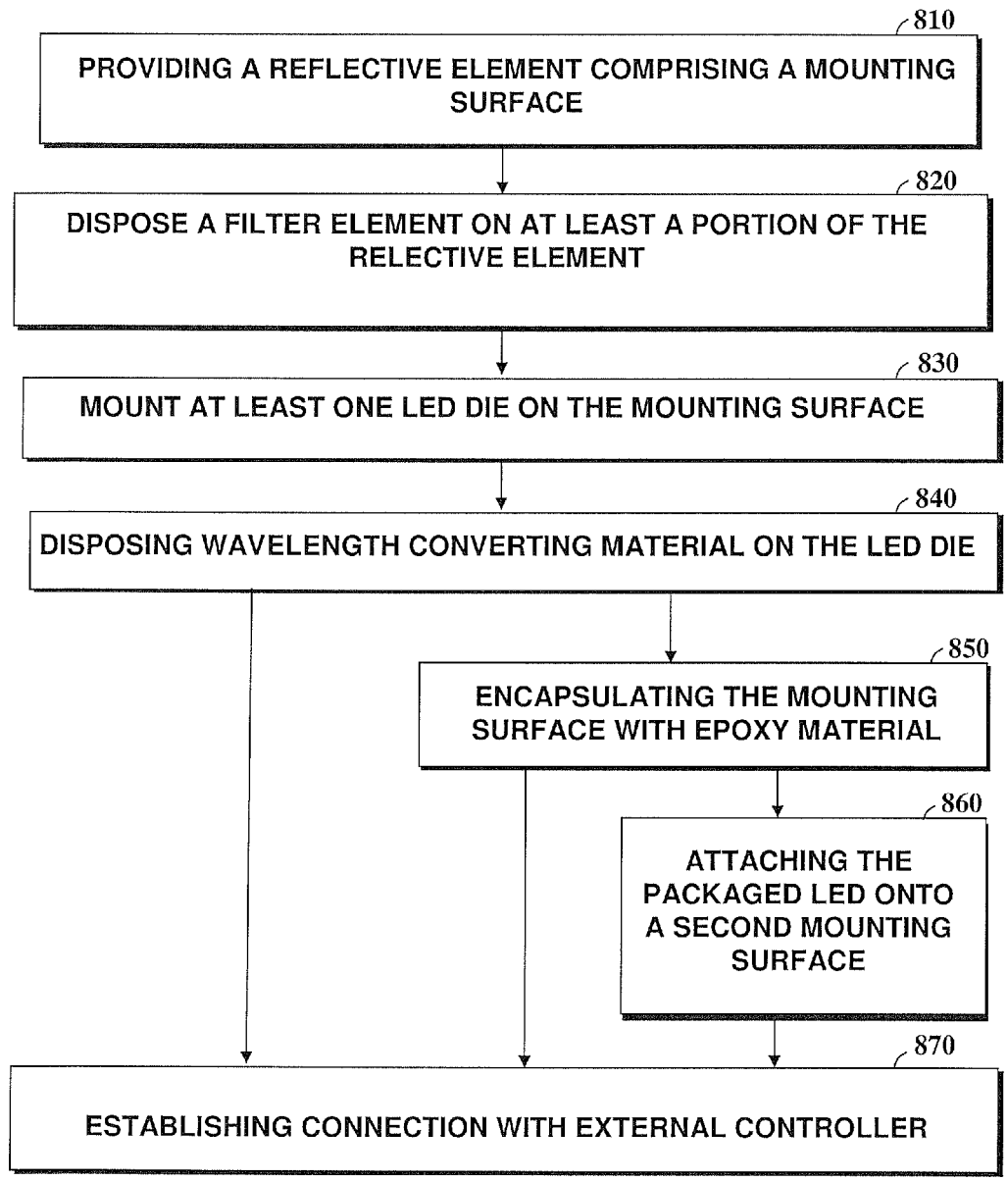
FIG. 8 shows a flow chart illustrating a method for manufacturing a light emitting device.

FIG. 8 shows a flow chart illustrating a method for making the light emitting devices disclosed in the embodiments shown in FIGS. 1-3 and FIGS. 6-7. In step 810, a reflective element comprising a mounting surface may be provided. In step 820, a filter element can be disposed on at least a portion of the reflective element. As illustrated in FIG. 6, the filter element may be disposed on multiple portions of the reflective element. In step 830, at least one LED die or device may be mounted on the mounting surface. This step may include die attach and wire bond. For large scale light emitting devices shown in FIGS. 6-7, the LED dies may be arranged in matrix form. For light emitting devices 100, 200 and 300 shown in FIGS. 1-3, multiple LED dies may be assembled onto the mounting surfaces 116, 216 and 316, respectively. The LED dies may be configured to emit a first light radiation.

In step 840, a wavelength converting material can be disposed on each of the at least one LED die. The wavelength converting material may be configured to convert the first light radiation into a second light radiation with a multiplicity of wavelengths. As discussed in the embodiment shown in FIG. 6, a wavelength converting material may be disposed to cover all the LED dies attached to the surface or disposed on multiple portions with each portion covering at least one LED die. After step 840, the light emitting device 300 shown in FIG. 3 may be obtained.

In step 850, the LED die, the wavelength converting material and the filter element may be encapsulated with an epoxy material or other known encapsulating material by any known means, such as a molding process. In some situations, the epoxy may form a lens. For example, the light emitting devices 100 and 200 shown in FIGS. 1-2 with lens 180 and 280 may be obtained by completing step 850.

The large scale light emitting device 700 shown in FIG. 7 may be obtained through further steps 860 and 870. In step 860, a plurality of the encapsulated light emitting devices obtained through steps 810 to 840, or steps 810 to 850 may be attached onto a second mounting surface. This followed by step 870, in which electrical connections to each of the packaged LEDs may be established, such that each of the packaged LEDs may be configured to turn on or off in accordance with a predetermined signal from an external controller (not shown). The large scale light emitting device 600 shown in FIG. 6 may be obtained following steps 810 to 840 followed by step 870.

Although specific embodiments of the invention have been described and illustrated herein above, the invention is not to be limited to the specific forms or arrangements of parts so described and illustrated herein. For example, the LED die may include any future light source with similar characteristics, and the yellow ring effect discussed should be construed to include any other similar color uniformity issues. The scope of the invention is to be defined by the claims appended hereto and their equivalents.

What is claimed is:

1. A light emitting device, comprising:
    a reflective element, the reflective element comprising a mounting surface;
    an LED die located on the mounting surface, the LED die configured to emit a first light radiation;
    a wavelength converting material covering the LED die, the wavelength converting material configured to convert the first light radiation into a second light radiation having a multiplicity of wavelengths; and
    a filter element disposed on a portion of the reflective element, the filter element comprising a material configured to preferentially attenuate light passing through the filter element at a trim wavelength.

2. The light emitting device of claim 1, wherein the reflective element comprises a reflective surface and wherein the reflective surface abuts the mounting surface and forms a reflective cup around the mounting surface.

3. The light emitting device of claim 2, wherein the filter element comprises glass material having a shape substantially form fit into the reflector cup.

4. The light emitting device of claim 1, wherein the mounting surface has a circular shape, and wherein the filter element is disposed on an outer ring portion of the mounting surface, and wherein the LED die is located in an inner ring portion of the mounting surface; wherein the filter element is not present on the mounting surface at the inner ring portion where the LED die is located.

5. The light emitting device of claim 1, wherein the filter element comprises a plurality of thin layers of transparent dielectric material on the reflective element, and wherein each of the plurality of thin layers is configured to preferentially attenuate light of a specific wavelength.

6. The light emitting device of claim 1, wherein the filter element comprises a pigment color filter.

7. The light emitting device of claim 1, wherein the filter element comprises an interference filter fabricated on glass.

8. The light emitting device of claim 1, wherein the trim wavelength is between 500 nm and 550 nm.

9. The light emitting device of claim 1, wherein the LED die, at least a portion of the reflective element, the wavelength converting material and the filter element are encapsulated by an epoxy material, and wherein at least a portion of the epoxy material forms a lens.

10. The light emitting device of claim 1, wherein the wavelength converting material comprises a yellow light emitting phosphor.

11. The light emitting device of claim 1, wherein the light emitting device forms a portion of an electronic display sign system.

12. The light emitting device of claim 1, wherein the light emitting device forms a portion of a flash for a camera.

13. An electronic display sign system, comprising:
    at least one reflective element, the reflective element comprising a mounting surface;
    a plurality of LED dies directly or indirectly attached to the mounting surface, the plurality of LED dies configured to emit a first light radiation in accordance with signals from an external controller;
    a wavelength converting material covering each of the plurality of LED dies, the wavelength converting material configured to convert the first light radiation into a second light radiation having a multiplicity of wavelengths; and
    a filter element covering a portion of the reflective element, the filter element comprising a material configured to preferentially attenuate light passing through the filter element at least at one predetermined trim wavelength.

14. The electronic display signs system of claim 13, wherein the filter element is formed by depositing a plurality of thin layers of transparent dielectric material onto the at least one reflective element, and wherein each of the plurality of thin layers is operable to attenuate preferentially light of a specific wavelength.

15. The electronic display signs system of claim 13, wherein the at least one predetermined trim wavelength is between 500 nm and 550 nm.

16. The electronic display signs system of claim 13, wherein the wavelength converting material comprises a yellow light emitting phosphor layer.

17. A flash device for a camera, comprising:
    a reflective element, the reflective element comprising a mounting surface;
    a filter element on a portion of the reflective element, the filter element comprising a material configured to preferentially attenuate light at a predetermined trim wavelength;
    at least one LED die on the mounting surface, the at least one LED die operable to emit a first light radiation; and
    a wavelength converting material covering the at least one LED die, wherein the wavelength converting material is configured to convert the first light radiation into a second light radiation having a multiplicity of wavelengths.

18. The camera flash device of claim 17, wherein the at least one LED die is arranged in a matrix form and each of the at least one LED die is configured to turn on or off in accordance with external electronic signals.

19. The camera flash device of claim 17 further comprising:
    the at least one LED die, the wavelength converting material and at least a portion of reflective element being encapsulated with an epoxy material.

20. The camera flash device of claim 17, wherein the filter element comprises a plurality of thin layers of transparent dielectric material on the reflective element, and wherein each of the plurality of thin layers is operable to preferentially attenuate light of a specific wavelength.

* * * * *